United States Patent
Nie et al.

(10) Patent No.: US 11,355,196 B2
(45) Date of Patent: Jun. 7, 2022

(54) METHOD FOR PROGRAMMING NAND FLASH MEMORY

(71) Applicant: CHINA FLASH CO., LTD., Shanghai (CN)

(72) Inventors: Hong Nie, Shanghai (CN); Jingwei Chen, Shanghai (CN)

(73) Assignee: CHINA FLASH CO., LTD., Shanghai (CN)

(*) Notice: Subject to any disclaimer, the term of this patent is extended or adjusted under 35 U.S.C. 154(b) by 0 days.

(21) Appl. No.: 17/380,720

(22) Filed: Jul. 20, 2021

(65) Prior Publication Data

US 2022/0084598 A1    Mar. 17, 2022

(30) Foreign Application Priority Data

Sep. 11, 2020 (CN) .......................... 202010955900.7

(51) Int. Cl.
*G11C 16/04* (2006.01)
*G11C 16/10* (2006.01)

(52) U.S. Cl.
CPC .......... *G11C 16/10* (2013.01); *G11C 16/0483* (2013.01)

(58) Field of Classification Search
CPC ................................................. G11C 16/0425
USPC ..................................................... 365/185.14
See application file for complete search history.

(56) References Cited

U.S. PATENT DOCUMENTS

2009/0168531 A1* 7/2009 Shirota ............. G11C 16/3418
365/185.15
2017/0271016 A1    9/2017 Choi et al.

FOREIGN PATENT DOCUMENTS

| CN | 101510442 A | 8/2009 |
|---|---|---|
| CN | 102270503 A | 12/2011 |
| CN | 102509727 A | 6/2012 |
| CN | 104240759 A | 12/2014 |
| CN | 105931667 A | 9/2016 |
| CN | 108877864 A | 11/2018 |
| CN | 108986861 A | 12/2018 |

\* cited by examiner

*Primary Examiner* — Jason Lappas
(74) *Attorney, Agent, or Firm* — Global IP Services; Tianhua Gu

(57) ABSTRACT

The present disclosure relates to a method for programming a NAND flash memory, which includes: providing a NAND flash memory array, and initializing a to-be-programmed memory cell; applying a drain voltage to the drain of the to-be-programmed memory cell, and floating the source of the to-be-programmed memory cell; and applying a programming voltage to the gate of the to-be-programmed memory cell, and discharging the voltage at each end of the to-be-programmed memory cell after maintaining the voltage for a first time period, to complete programming; a difference between the voltage applied to the drain and the voltage applied to the substrate of the to-be-programmed memory cell being not less than 4 V, the first time period being not longer than 100 μs, and the programming voltage being not higher than 10 V.

9 Claims, 4 Drawing Sheets

METHOD FOR PROGRAMMING NAND FLASH MEMORY

CROSS REFERENCE TO RELATED APPLICATION

The present application claims the benefit of priority to Chinese Patent Application No. CN 2020109559007, entitled "METHOD FOR PROGRAMMING NAND FLASH MEMORY", filed with CNIPA on Sep. 11, 2020, the disclosure of which is incorporated herein by reference in its entirety for all purposes.

TECHNICAL FIELD

The present disclosure relates to integrated circuits, and in particular, to a method for programming a programing NAND flash memory.

BACKGROUND

Flash memory is a commonly used semiconductor memory that does not lose information when powered off. Flash memory has various advantages, such as small size, low power consumption, and resistance to physical damage. Therefore, flash memory may be an ideal storage medium for mobile digital products, and many conventional electronic devices utilize flash memory as their core storage medium.

There are mainly two types of flash memory: NAND and NOR, which are categorized based on the array architectures of the memory cells contained therein. The NAND type is more suitable for highly-integrated chips, and has higher read/write speeds. However, NAND flash memory does not support single-byte writing into the flash memory, and the writing operation needs to be performed on a data-block basis. The NOR type supports single-byte writing into the flash memory, and also supports high-speed reading. However, NOR flash memory's write speed is relatively low, and its quality decreases as the memory size increases.

NAND type flash memory's most popular applications include USB flash drives, as well as memory cards for digital cameras and digital video cameras. A conventional NAND flash memory programming mechanism is based on electronic tunneling. However, such programming mechanism may have two disadvantages: high programming voltage and long programming time, which may lead to high stresses on the structures of the tunnel oxide layers in the memory cells. Such a high stress may greatly affect the lifespan of the memory cells.

Therefore, the shortened lifespan of the memory cells caused by the high programming voltage and the long programming time has become a problem for the conventional NAND flash memory.

SUMMARY

In view of the disadvantages of the conventional NAND flash memory, the present disclosure provides a method for programming a NAND flash memory which may alleviate the tunnel oxide damage caused by high programming voltage and long programming time, thereby greatly increase the lifespan of memory cells.

Specifically, the present disclosure provides a method for programming a NAND flash memory. The method for programming a NAND flash memory at least comprises:

S1) providing a NAND flash memory array, and initializing a to-be-programmed memory cell;

S2) applying a drain voltage to the drain of the to-be-programmed memory cell, and floating the source of the to-be-programmed memory cell; and S3) applying a programming voltage to the gate of the to-be-programmed memory cell, and discharging the voltage at each end of the to-be-programmed memory cell after maintaining the voltage for a first time period, to complete programming.

Specifically, the difference between the voltage applied to the drain and the voltage applied to the substrate of the to-be-programmed memory cell is not less than 4 V, the first time period is not longer than 100 μs, and the programming voltage is not higher than 10 V.

Optionally, the NAND flash memory array comprises n rows and b columns of memory cells; gates of memory cells in the same row are connected to the same word line; memory cells in the same column are sequentially connected in series, one end of each column is connected to a bit line strobe, and the other end is connected to a source voltage strobe; and n and b are natural numbers greater than 0.

Further optionally, voltages of the gate, the source, and a well electrode of the to-be-programmed memory cell are set to 0 V in operation S1), to achieve initialization.

Further optionally, the method for applying the drain voltage in operation S2) comprises: applying the drain voltage to a bit line where the to-be-programmed memory cell is located; and gating a bit line strobe of a column where the to-be-programmed memory cell is located, and a memory cell located between the to-be-programmed memory cell, and the bit line strobe of the column where the to-be-programmed memory cell is located, so that the drain voltage is transmitted to the drain of the to-be-programmed memory cell.

Further optionally, the method for floating the source of the to-be-programmed memory cell in operation S2) comprises: turning off a source voltage strobe of a column where the to-be-programmed memory cell is located, and applying any electric potential to a word line of a memory cell located between the to-be-programmed memory cell and the source voltage strobe of the column where the to-be-programmed memory cell is located, so that the source of the to-be-programmed memory cell is in a floating state.

Further optionally, in operation S3), the voltage applied to the gate of the to-be-programmed memory cell is increased from zero to the programming voltage within a second time period.

Further optionally, the second time period is set to be from 0 μs to 10 μs.

Further optionally, the difference between the voltage applied to the drain and the voltage applied to the substrate of the to-be-programmed memory cell is not less than 5 V.

Further optionally, operation S2) may be replaced by: first floating the source of the to-be-programmed memory cell, and then applying a drain voltage to the drain of the to-be-programmed memory cell.

As described above, the method for programming a NAND flash memory according to the present disclosure has the following beneficial effects:

In the present disclosure, in the method for programming a NAND flash memory, after initialization, the drain voltage is applied and the source is floating, the programming voltage is applied, to complete the programming based on a tertiary electron collision principle. The gate voltage herein during programming is much lower than the gate voltage of existing tunneling (F-N) programming manners, the programming time is shorter, and therefore the lifespan and programming efficiency of memory cells can be effectively improved, and power consumption can be reduced.

REFERENCE NUMERALS

Figure 1:
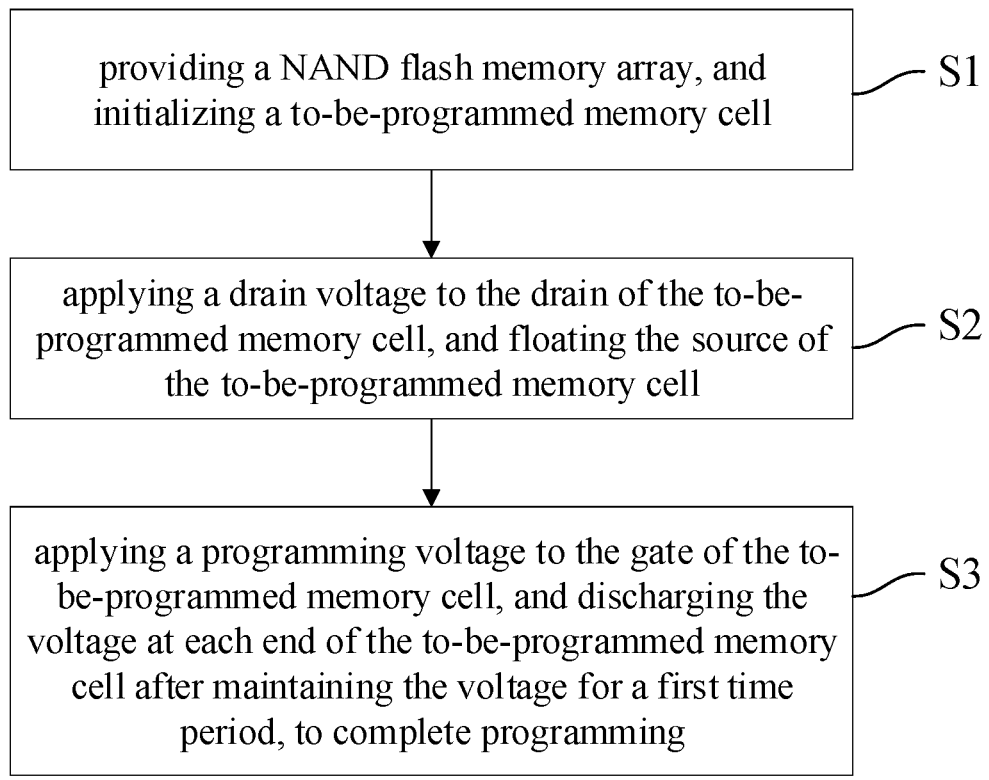
FIG. 1 is a schematic flowchart of a method for programming a NAND flash memory according to present disclosure.

1 NAND flash memory array
11 To-be-programmed memory cell
S1 to S3 Various Operations in the disclosed method.

DETAILED DESCRIPTION

The following describes implementations of the present disclosure by using specific embodiments. A person skilled in the art may easily understand other advantages and effects of the present disclosure from the content disclosed in this specification. The present disclosure may also be implemented or applied through other different specific implementations. Various details in this specification may also be modified or changed based on different viewpoints and applications without departing from the spirit of the present disclosure.

Reference is made to FIG. 1 to FIG. 4. It should be noted that the drawings provided in this disclosure only exemplify the basic idea of the present disclosure. Therefore, only the components related to the present disclosure are shown in the drawings, and may not necessarily be drawn according to the quantities, shapes, and sizes of the components during actual implementation. During actual implementation, the types, quantities, and proportions of the components may be changed without limitation, and the layout of the components may be more complex.

As shown in FIG. 1, the present disclosure provides a method for programming a NAND flash memory. The method for programming a NAND flash memory comprises the following operations (S1, S2, and S3):

S1) Providing a NAND flash memory array 1, and initializing a to-be-programmed memory cell 11 in the NAND flash memory array 1.

Figure 2:
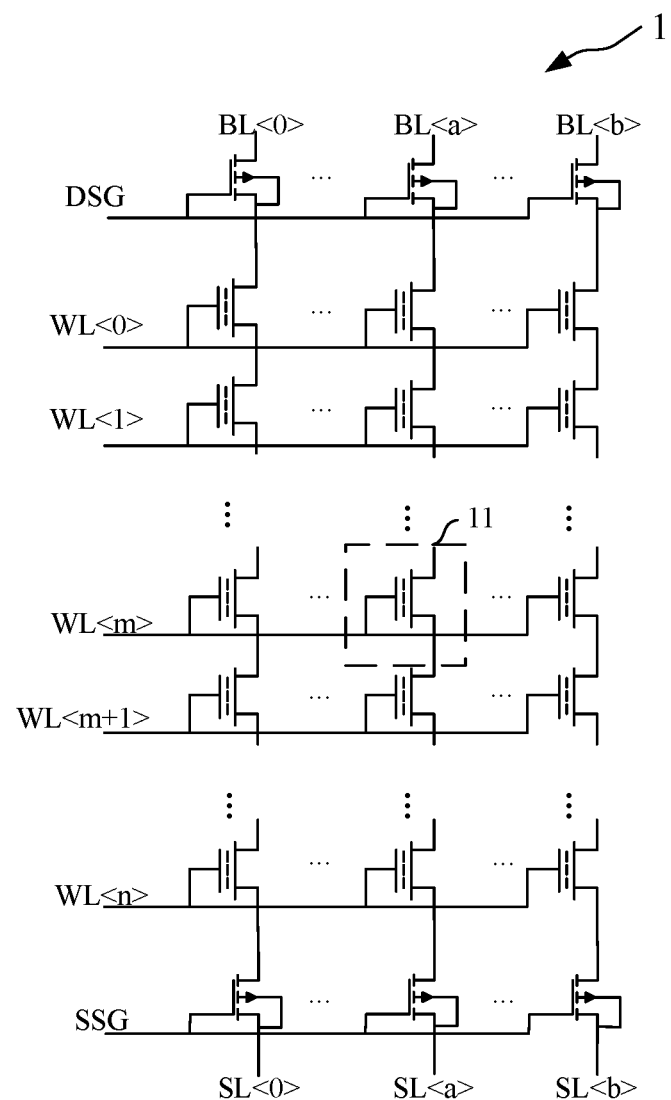
FIG. 2 is a schematic structural diagram of a NAND flash memory array according to the present disclosure.

In this Operation S1, as shown in FIG. 2, a NAND flash memory array 1 with n rows and b columns of memory cells is provided, where gates of memory cells in the same row are connected to the same word line, and memory cells in the same column are sequentially connected in series. For any two adjacent memory cells, the drain of a first memory cell is connected to the source of a second memory cell adjacent to the first memory cell. Further, one end of each column is connected to a bit line strobe (each bit line strobe is connected to a corresponding bit line), and the other end of each column is connected to a source voltage strobe (strobe may also be referred to as select gate, and each source voltage strobe is connected to a corresponding source line). The above n and b numbers are natural numbers greater than 0.

In this embodiment, word lines in different rows may be defined from top to bottom as WL<0>, WL<1>, WL<m>, WL<m+1>, ..., and WL<n>, bit lines in different columns may be defined from left to right as BL<0>, BL<a>, ..., and BL<b>. The source lines may be defined from left to right as SL<0>, SL<a>, ..., and SL<b>. The gate of each bit line strobe is connected to a bit line strobe control signal DSG, and the gate of each source voltage strobe is connected to a source line strobe control signal SSG.

Specifically, using a memory cell at $m^{th}$ row and $a^{th}$ column as an example of to-be-programmed memory cell 11, the voltages of the gate, source, and well terminals of the to-be-programmed memory cell 11 may be initially set to 0 V. As shown in FIG. 2, the $m^{th}$ word line WL<m> is grounded, so that the voltage of the gate of the to-be-programmed memory cell 11 is 0 V. In addition, the source line strobe control signal SSG, the $(m+1)^{th}$ word line WL<m+1> to the $n^{th}$ word line WL<n> are set at a high level, and the $a^{th}$ source line is grounded, so that the voltages of the source and the well terminals of the to-be-programmed memory cell 11 are 0 V.

S2) Applying a drain voltage to the drain of the to-be-programmed memory cell 11, and floating the source of the to-be-programmed memory cell 11.

Figure 3:
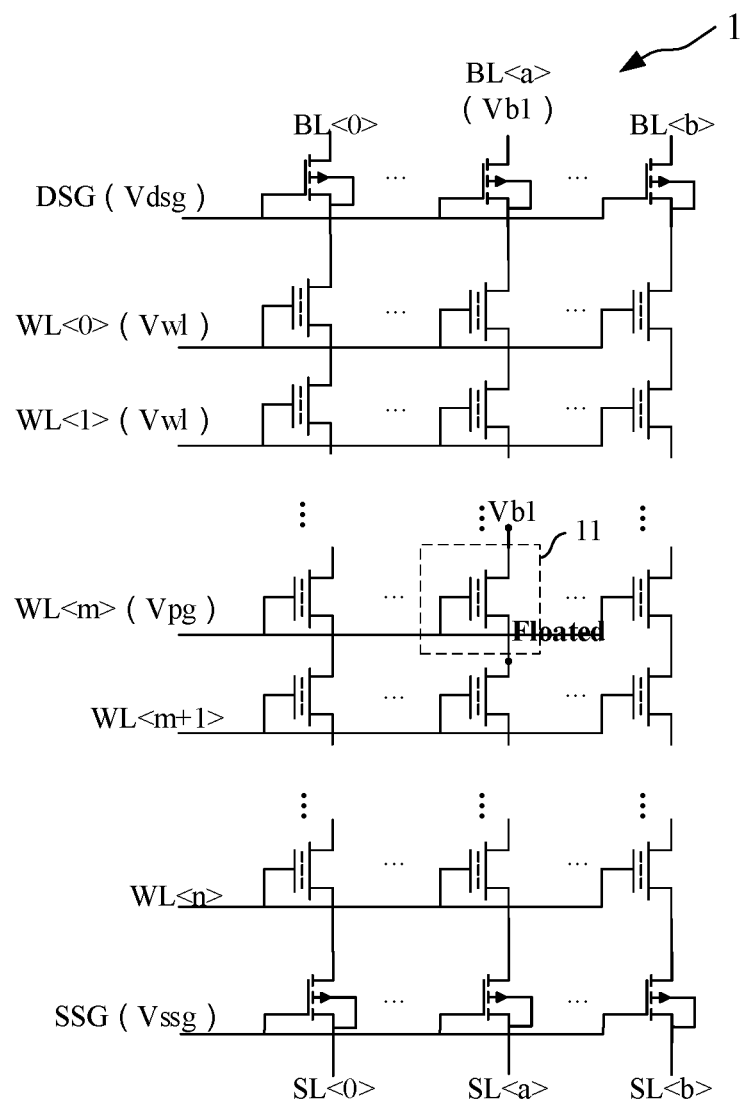
FIG. 3 shows the principle of applying a drain voltage and floating a source in a method for programming a NAND flash memory according to the present disclosure.

In this Operation S2, as shown in FIG. 3, a drain voltage Vb1 may be applied to the $a^{th}$ bit line BL<a>; the bit line strobe control signal DSG is set to a first high voltage Vdsg, to select the bit line strobe of the column where the to-be-programmed memory cell 11 is located. Also, a second high voltage Vwl may be applied from the 0th word line WL<0> to the $(m-1)^{th}$ word line WL<m-1>, to select the memory cells located between the to-be-programmed memory cell 11 and the bit line strobe of the column where the to-be-programmed memory cell 11 is located. Further, the drain voltage Vb1, which is applied to the $a^{th}$ bit line BL<a>, may be transmitted to the drain of the to-be-programmed memory cell 11.

In an example, the value of the first high voltage Vdsg may be equal to the value of the second high voltage Vwl. During actual implementation, the values of the first high voltage Vdsg and the second high voltage Vwl may be set to different voltages as required, provided that such voltages may be sufficient to drive corresponding modules. In another example, the difference between the voltage applied to the drain and the voltage applied to the substrate of the to-be-programmed memory cell may be no less than 4 V (e.g., the substrate is grounded, and the drain voltage Vb1 is 4 V or above), preferably 4.3 V, 5 V, 6 V, 8 V, or 10 V, so that the voltage can produce sufficiently large electric fields to generate tertiary electron collision.

Specifically, as shown in FIG. 3, the source line strobe control signal SSG may be set at a low voltage Vssg, in order to turn off source voltage strobes of the column in which the to-be-programmed memory cell 11 is located. In this embodiment, the low voltage Vssg may be set to about 0 V (grounded); and an arbitrary voltage may be applied to word lines from $(m+1)^{th}$ word line WL<m+1> to $n^{th}$ word line WL<n>. Such an arrangement may cause the voltages between the to-be-programmed memory cell 11 and the gates of the memory cells, which are located between the to-be-programmed memory cell 11 and the source voltage strobe of the column where the to-be-programmed memory cell 11 is located, to be a corresponding arbitrary voltage, and cause the source of the to-be-programmed memory cell 11 to be in a floating state.

It should be noted that, in this embodiment, the operations of applying the drain voltage and floating the source described above may be concurrently or simultaneously performed. In another implementation of the present disclosure, the source may first become floating and then the drain voltage is applied, the details of which are not described herein.

S3) Applying a programming voltage Vpg to the gate of the to-be-programmed memory cell 11, while the drain and the source of the to-be-programmed memory cell 11 remain in their previous states (that is, the drain of the to-be-programmed memory cell 11 is connected to the drain voltage Vb1, and the source of the to-be-programmed memory cell 11 is floating, as described in Operation S2); and discharging all voltages at every terminals of the to-be-programmed memory cell 11 after maintaining these voltages for a first time period, to complete the programming of the memory cell.

Figure 4:
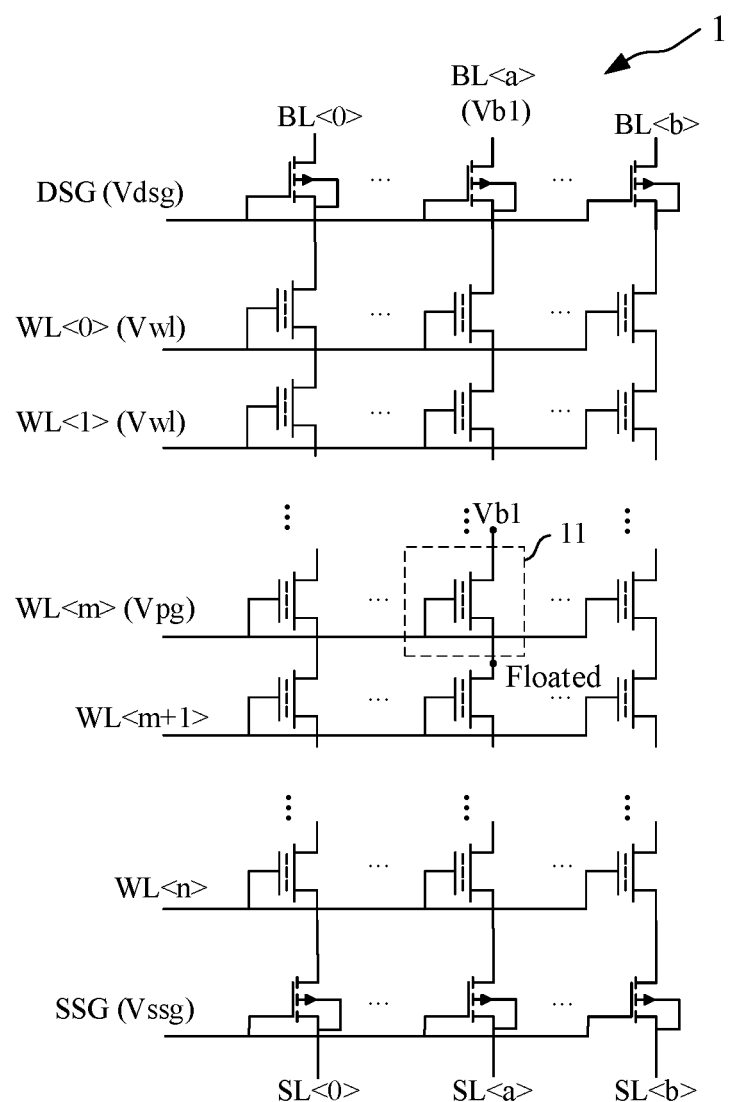
FIG. 4 shows the principle of applying a programming voltage in a method for programming a NAND flash memory according to the present disclosure.

In Operation S3, as shown in FIG. 4, the voltage applied to the gate of the to-be-programmed memory cell 11 is increased from zero to the programming voltage Vpg within a second time period. In this embodiment, the second time period may be set to a value ranging from 0 μs to 10 μs (e.g., 1 μs or 2 μs). During actual implementation, the second time period may be adjusted as required.

Specifically, in this embodiment, the first time period may be a specific time value that is not longer than 100 μs (e.g., 5 μs or 10 μs). The duration of the first time period may be adjusted based on which fabrication process is adapted, which are not listed one by one herein.

Further, in this embodiment, the programming voltage Vpg may be a voltage that is not higher than 10 V, (e.g., 5 V, 7 V, 8 V, or 9 V), which are not listed one by one herein.

The principle of the programming of a NAND flash memory according to the present disclosure is as follows:

After initialization, the source of the to-be-programmed memory cell 11 is floating, the drain voltage Vb1 is applied to the drain, and the substrate is grounded. At this time, a transverse electric field is generated in the to-be-programmed memory cell 11, electron-hole pairs are generated, and primary electron movement is created in which electrons are moving toward the drain. The primary electron movement may force electrons to strike the side walls of the drain region of the memory cell 11, causing electron-holes to move downward and collide with the substrate of the to-be-programmed memory cell 11, thereby generating secondary electrons. The programming voltage Vpg is then applied to the gate of the to-be-programmed memory cell 11, so that the secondary electrons generate tertiary electrons under the action of a vertical electric field, and the tertiary electrons may be injected into a floating gate of the to-be-programmed memory cell 11 to complete the programming operation.

Thus, the present disclosure is based on the tertiary electron collision. The lateral and vertical electric fields may be simultaneously formed, which may lower the gate voltage of a programming cell from about 20 V to below 10 V, and reduce the programming time from milliseconds to microseconds. In other words, high voltage and long programming time encountered during the programming of a conventional NAND Flash memory array can be effectively alleviated, thereby improving the lifespan and programming efficiency of the memory cell, and reducing power consumption.

In summary, the present disclosure provides a method for programming a NAND flash memory, comprising: S1) providing a NAND flash memory array, and initializing a to-be-programmed memory cell; S2) applying a drain voltage to the drain of the to-be-programmed memory cell, and floating the source of the to-be-programmed memory cell; and S3) applying a programming voltage to the gate of the to-be-programmed memory cell, and discharging voltages at each terminals of the to-be-programmed memory cell after maintaining these voltages for a first time period, which completes the programming of the NAND flash memory. The difference between the voltage applied to the drain and the voltage applied to the substrate of the to-be-programmed memory cell being not less than 4 V, the first time period being not longer than 100 μs, and the programming voltage being not higher than 10 V.

In the method for programming a NAND flash memory according to the present disclosure, after initialization, the drain voltage is applied and the source is floating, and then the programming voltage is applied to complete the programming. The gate voltage during programming is much lower than the gate voltage of an existing tunneling (F-N) programming manner, the programming time is shorter, the lifespan and programming efficiency of a memory cell can be effectively improved, and power consumption can be reduced. Therefore, the present disclosure has a high advantage in industrial applications.

The foregoing embodiments merely exemplify the principles and effects of the present disclosure, but are not intended to limit the present disclosure. Any person skilled in the art may make modifications or changes on the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:

1. A method for programming a NAND flash memory, comprising:
   a first step initializing a to-be-programmed memory cell in a NAND flash memory array;
   a second step applying a drain voltage to a drain of the to-be-programmed memory cell, applying a substrate voltage to a substrate of the to-be-programmed memory cell, and floating a source of the to-be-programmed memory cell, to generate electron-hole pairs in the to-be-programmed memory cell, and create primary electron movement in which electrons are moving toward the drain; wherein the primary electron movement forces electrons to strike a side wall of a drain region of the to-be-programmed memory cell, causing the electron-holes to move downward and collide with the substrate of the to-be-programmed memory cell, thereby generating secondary electrons; and
   a third step applying a programming voltage to a gate of the to-be-programmed memory cell, so that the secondary electrons generate tertiary electrons under an action of a vertical electric field and the tertiary electrons are injected into a floating gate of the to-be-programmed memory cell; and discharging the voltage at each end of the to-be-programmed memory cell after maintaining the voltage for a first time period before complete programming;
   wherein a difference between the voltage applied to the drain and the voltage applied to the substrate of the to-be-programmed memory cell is not less than 4 V, the first time period is not longer than 100 us, and the programming voltage is not higher than 10 V.

2. The method for programming a NAND flash memory as in claim 1,
wherein the NAND flash memory array comprises n rows and b columns of memory cells and gates of memory cells in the same row are connected to the same word line,
wherein memory cells in the same column are sequentially connected in series, one end of each column is connected to a bit line strobe, and the other end is connected to a source voltage strobe, and
wherein n and b are natural numbers greater than 0.

3. The method for programming a NAND flash memory as in claim 2, wherein voltages of the gate, the source, and a well terminals of the to-be-programmed memory cell are set as 0 V in the first step to achieve initialization.

4. The method for programming a NAND flash memory as in claim 2, wherein the applying the drain voltage in the second step comprises:
applying the drain voltage to a bit line where the to-be-programmed memory cell is located; and gating a bit line strobe of a column where the to-be-programmed memory cell is located, and a memory cell located between the to-be-programmed memory cell and the bit line strobe of the column where the to-be-programmed memory cell is located, so that the drain voltage is transmitted to the drain of the to-be-programmed memory cell.

5. The method for programming a NAND flash memory as in claim 2, wherein the floating the source of the to-be-programmed memory cell in the second step comprises:
turning off the source voltage strobe of the column where the to-be-programmed memory cell is located; and
applying an arbitrary voltage to word lines corresponding to the memory cells located between the to-be-programmed memory cell and the source voltage strobe of the column where the to-be-programmed memory cell is located so that the source of the to-be-programmed memory cell is in a floating state.

6. The method for programming a NAND flash memory as in claim 2, wherein:
at the third step, the voltage applied to the gate of the to-be-programmed memory cell is increased from zero to the programming voltage within a second time period.

7. The method for programming a NAND flash memory as in claim 6, wherein:
the second time period is set as from 0 μp to 10 μs.

8. The method for programming a NAND flash memory as in claim 1, wherein:
a difference between the voltage applied to the drain and the voltage applied to the substrate of the to-be-programmed memory cell is not less than 5 V.

9. The method for programming a NAND flash memory as in claim 1, wherein:
in the second step, performing the floating the source of the to-be-programmed memory cell, and then applying a drain voltage to the drain of the to-be-programmed memory cell.

* * * * *